United States Patent
Kanisawa et al.

(10) Patent No.: US 8,444,882 B2
(45) Date of Patent: May 21, 2013

(54) ANISOTROPIC CONDUCTIVE FILM AND LIGHT EMITTING DEVICE

(75) Inventors: Shiyuki Kanisawa, Tochigi (JP);
Hiroyuki Kumakura, Tochigi (JP);
Hidetsugu Namiki, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 187 days.

(21) Appl. No.: 13/142,956

(22) PCT Filed: Feb. 22, 2010

(86) PCT No.: PCT/JP2010/052600
§ 371 (c)(1),
(2), (4) Date: Jun. 30, 2011

(87) PCT Pub. No.: WO2010/098273
PCT Pub. Date: Sep. 2, 2010

(65) Prior Publication Data
US 2011/0266578 A1 Nov. 3, 2011

(30) Foreign Application Priority Data

Feb. 27, 2009 (JP) .................................. 2009-045337
Mar. 11, 2009 (JP) .................................. 2009-057316

(51) Int. Cl.
*H01B 1/02* (2006.01)
*H01B 1/22* (2006.01)
*H01L 33/00* (2010.01)
*B32B 5/16* (2006.01)

(52) U.S. Cl.
USPC ............ 252/514; 252/500; 252/512; 428/323; 257/98; 257/E33.067; 257/E33.068; 257/E33.071

(58) Field of Classification Search
USPC ............. 257/98, E33.067, E33.068, E33.071; 252/500, 512, 514; 428/323
See application file for complete search history.

(56) References Cited

U.S. PATENT DOCUMENTS

| 2005/0133808 A1 | 6/2005 | Uraya et al. |
| 2012/0193666 A1 * | 8/2012 | Namiki et al. .................. 257/98 |
| 2012/0248495 A1 * | 10/2012 | Umakoshi et al. .............. 257/99 |

FOREIGN PATENT DOCUMENTS

| JP | 07326476 | * | 5/1994 |
| JP | A-07-092305 | | 4/1995 |

(Continued)

OTHER PUBLICATIONS

International Preliminary Report on Patentability issued in Application No. PCT/JP2010/052600; Dated Oct. 27, 2011.

(Continued)

*Primary Examiner* — Victor A Mandala
(74) *Attorney, Agent, or Firm* — Oliff & Berridge, PLC

(57) ABSTRACT

An anisotropic conductive film is provided that does not have a light-reflecting layer on a light emitting diode element which causes costs to increase when a light emitting device that uses an LED element is flip-chip mounted, and that does not cause emission efficiency to deteriorate. Further, a light emitting device that uses such an anisotropic conductive film is provided. This anisotropic conductive film has a structure in which a light-reflecting insulating adhesive layer and an anisotropic conductive adhesive layer are laminated, wherein the light-reflecting insulating adhesive layer has a structure in which light-reflecting particles are dispersed in an insulating adhesive. The light emitting device has a structure in which a light emitting diode element is flip-chip-mounted on a substrate, with this anisotropic conductive film provided between a connection terminal on the substrate and a bump for connection of the light emitting diode element.

12 Claims, 2 Drawing Sheets

FOREIGN PATENT DOCUMENTS

| | | |
|---|---|---|
| JP | A-11-168235 | 6/1999 |
| JP | A-2002-270641 | 9/2002 |
| JP | A-2005-159263 | 6/2005 |
| WO | WO 2008/020482 A1 | 2/2008 |

OTHER PUBLICATIONS

International Search Report issued in Application No. PCT/JP2010/052600; Dated Mar. 23, 2010 (With Translation).

* cited by examiner

ANISOTROPIC CONDUCTIVE FILM AND LIGHT EMITTING DEVICE

TECHNICAL FIELD

The present invention relates to an anisotropic conductive film and a light emitting device.

BACKGROUND ART

Light emitting devices that use a light emitting diode (LED) element are widely used. Older-type light emitting devices are configured by, as illustrated in FIG. 3, joining an LED element 33 to a substrate 31 with a die bond adhesive 32, wire-bonding a p electrode 34 and an n electrode 35 on an upper face of the LED element 33 to a connection terminal 36 on the substrate 31 with a gold wire 37, and then sealing the whole of the LED element 33 with a transparent mold resin 38. However, for the light emitting device illustrated in FIG. 3, there is the problem that, of the light emitted by the LED element 33, the light having a wavelength of 400 to 500 nm that is output to the upper face side is absorbed by the gold wire 37. Further, there is the problem that part of the light output to the lower face side is absorbed by the die bond adhesive 32, whereby the emission efficiency of the LED element 33 deteriorates.

Consequently, as illustrated in FIG. 4, flip-chip mounting of the LED element 33 has been proposed (Patent Document 1). In this flip-chip mounting technique, bumps 39 are formed on both the p electrode 34 and the n electrode 35. Further, a light-reflecting layer 40 is provided on the surface of the LED element 33 on which the bumps are formed, so that the layer 40 is insulated from the p electrode 34 and the n electrode 35. The LED element 33 and the substrate 31 are fixedly connected using an anisotropic conductive paste 41. Consequently, in the light emitting device illustrated in FIG. 4, the light output toward the upper side of the LED element 33 is not absorbed by the gold wire, and most of the light output toward the lower side is reflected by the light-reflecting layer 40 and is output upwards. As a result, the emission efficiency does not deteriorate.

CITATION LIST

Patent Document

[Patent Document 1] Japanese Patent Application Laid-Open No. Hei. 11-168235

SUMMARY OF THE INVENTION

Problem to be Solved by the Invention

However, with the technique described in Patent Document 1, the light-reflecting layer 40 has to be provided on the LED element 33 by a method such as metal vapor deposition so as to be insulated from the p electrode 34 and the n electrode 35. Therefore, from a production perspective, there is the problem that an increase in costs cannot be avoided.

It is an object of the present invention to resolve the above-described problem in the conventional art. It is also an object of the present invention to provide an anisotropic conductive film that does not have a light-reflecting layer on a light emitting diode (LED) element which causes costs to increase when a light emitting device that uses an LED element is flip-chip mounted, and that does not cause emission efficiency to deteriorate. Further, it is also an object of the present invention to provide a light emitting device that uses such an anisotropic conductive film.

Means for Solving the Problems

The present inventor has discovered that the above objects can be achieved by making an anisotropic conductive film have a light-reflecting function. Specifically, the present inventor has conceived that the anisotropic conductive film has a dual-layer structure, in which one layer serves as a light-reflecting insulating adhesive layer, and the other layer serves as an anisotropic conductive adhesive layer, thereby completing the present invention.

More specifically, the present invention provides an anisotropic conductive film having a structure in which a light-reflecting insulating adhesive layer and an anisotropic conductive adhesive layer are laminated, wherein the light-reflecting insulating adhesive layer has a structure in which light-reflecting particles are dispersed in an insulating adhesive.

Further, the present invention provides a light emitting device in which a light emitting diode element is flip-chip-mounted on a substrate, with an anisotropic conductive film provided between a connection terminal on the substrate and a bump for connection of the light emitting diode element, wherein the anisotropic conductive film is a structure in which a light-reflecting insulating adhesive layer and an anisotropic conductive adhesive layer are laminated, the light-reflecting insulating adhesive layer being a structure in which light-reflecting particles are dispersed in an insulating adhesive.

Advantages of the Invention

The anisotropic conductive film according to the present invention has a structure in which a light-reflecting insulating adhesive layer and an anisotropic conductive adhesive layer are laminated. Therefore, in a light emitting device produced by anisotropic conductive connection of an LED element and a substrate using this anisotropic conductive film, of the light emitted by the LED element, the light emitted towards the substrate side (i.e., the back face side of the LED element) is reflected by the light-reflecting insulating adhesive layer and is output from the front face side. Consequently, the emission efficiency of the light emitting device does not deteriorate.

MODE FOR CARRYING OUT THE INVENTION

The present invention will now be described in more detail with reference to the drawings.

Figure 1:
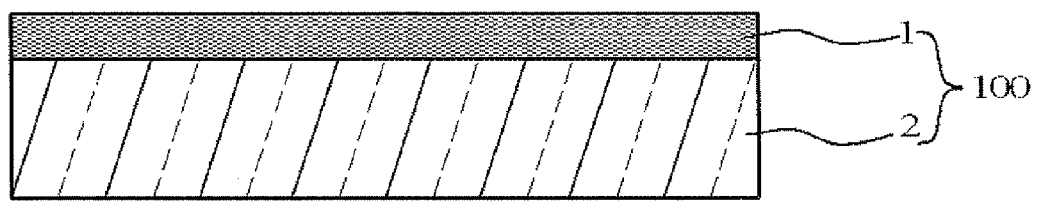
FIG. 1 is a cross sectional view of an anisotropic conductive film of the present invention.

FIG. 1 is a cross sectional view of an anisotropic conductive film 100 of the present invention. This anisotropic conductive film 100 has a structure in which a light-reflecting insulating adhesive layer 1 and an anisotropic conductive adhesive layer 2 are laminated. The light-reflecting insulating adhesive layer 1 has a structure in which light-reflecting particles are dispersed in an insulating adhesive. Therefore, the light incident on the anisotropic conductive film 100 from the light-reflecting insulating adhesive layer 1 side is, depending on the properties of the light-reflecting particles, reflected to the incident side. Further, even if part of the light incident from the anisotropic conductive adhesive layer 2 side is absorbed or scattered by the anisotropic conductive adhesive layer 2, most of the light is reflected by the light-reflecting insulating adhesive layer 1 and is output from the anisotropic conductive adhesive layer 2. Therefore, the emission efficiency of the LED element can be prevented from deteriorating.

In the present invention, as the insulating adhesive constituting the light-reflecting insulating adhesive layer 1, an adhesive that is used as an insulating binder resin in a conventional anisotropic conductive adhesive film may be appropriately employed. For example, a thermosetting adhesive can be used which includes a cross-linking agent, such as an acid anhydride, an imidazole compound, and cyanogen, in an epoxy resin having an alicyclic epoxy resin, a hydrogenated epoxy resin or the like as a main component. From the perspective of adhesion properties, for example, it is preferred to use the same kind of material for the insulating adhesive constituting the light-reflecting insulating adhesive layer 1 and the binder constituting the below-described anisotropic conductive adhesive layer 2.

Examples of light-reflecting particles that can be used include calcium carbonate, particles of metallic oxides, such as titanium dioxide, silicon dioxide, and aluminum oxide, and metal particles of nickel, silver, aluminum and the like that are covered with an insulating coating. Examples of the shape of the particles include amorphous, spherical, scale-like, needle-like and the like. Among these, from the perspective of a light diffusion effect, spherical is preferred, and from a total reflection effect, a scale-like shape is preferred. From the perspective of light reflectance, scale-like silver particles are especially preferred.

Although the size of the light-reflecting particles depends on the shape, generally, if the size is too large, connection with the anisotropic conductive particles can be hindered, while if the size is too small, light is not as reflected as easily. Therefore, the particle size is preferably, for a spherical shape, 0.1 to 30 µm, and more preferably 0.2 to 10 µm. For a scale-like shape, the long diameter is preferably 0.1 to 100 µm, and more preferably 1 to 50 µm and the thickness is preferably 0.01 to 10 µm, and more preferably 0.1 to 5 µm. Here, if the particles are covered with an insulating coating, the size of the light-reflecting particles is the size that includes this insulating coating.

From the perspective of connection reliability, it is preferred that the thickness of the light-reflecting insulating adhesive layer 1 is as thin as possible, as long as the intended light-reflecting properties can be obtained. Usually, the thickness is 2 to 30 µm. The mixing ratio of the insulating adhesive and the light-reflecting particles in the light-reflecting insulating adhesive layer 1 depends on the shape of the light-reflecting particles. Assuming a thickness in the above-described range, the mixing ratio of light-reflecting particles when the light-reflecting particles have a scale-like shape is, based on 100 parts by mass of insulating adhesive, preferably 1 to 200 parts by mass, and more preferably 10 to 100 parts by mass.

If the light-reflecting particles are metal particles covered with an insulating coating, various insulating resins may be used as the insulating coating on the metal particles. From perspectives such as mechanical strength and transparency, it is preferred to use a cured acrylic resin. A preferred example is a resin coating formed by radical copolymerization of methyl methacrylate and 2-hydroxyethyl methacrylate in the presence of a radical initiator, such as benzoyl peroxide and other organic peroxides. In this case, it is more preferred that the resin coating be cross-linked with an isocyanate cross-linking agent, such as 2,4-tolylene diisocyanate. Even if the light-reflecting particles are metallic oxide particles, from the perspective of dispersion stability, it is preferred to cover the particles with the same insulating coating as that for the metal particles.

For the metal particles, it is preferred that a γ-glycidoxy group, a vinyl group and the like has been introduced onto the surface of the metal in advance with a silane coupling agent.

As the anisotropic conductive adhesive layer 2 constituting the anisotropic conductive film 100 of the present invention, a layer having the same structure as a conventional anisotropic conductive film can be used. Generally, a layer formed by dispersing conductive particles for anisotropic conductive connection in a thermosetting adhesive is used. Examples of such a thermosetting adhesive include an adhesive formed by including a cross-linking agent, such as an acid anhydride, an imidazole compound, and cyanogen, in an epoxy resin having an alicyclic epoxy resin, a hydrogenated epoxy resin or the like as a main component. Further, examples of the conductive particles for anisotropic conductive connection that may be used include metal particles of gold, nickel and the like, or metallic coated resin particles formed by coating the surface of resin particles, such as of a benzoguanamine resin, with a metal such as nickel.

These conductive particles have a spherical shape, so that if their particle size is too large, connection reliability deteriorates. Therefore, it is preferred that the particle size is 1 to 20 µm, and more preferably 3 to 10 µm.

To obtain the intended connection reliability, generally, the thickness of the anisotropic conductive adhesive layer 2 is 5 to 40 µm. Based on a thickness in this range, the mixing ratio of the insulating adhesive and the conductive particles in the anisotropic conductive adhesive layer 2 is, based on 100 parts by mass of insulating adhesive, preferably 1 to 50 parts by mass of conductive particles, and more preferably 10 to 25 parts by mass.

The anisotropic conductive film according to the present invention can be produced as follows. First, the light-reflecting particles and the insulating adhesive are dispersed and mixed in a solvent such as toluene. The mixture is coated to a desired thickness on a release-treated PET film, and then dried at a temperature of about 80° C. to produce a light-reflecting insulating adhesive layer film. Separately, conductive particles for anisotropic conductive connection and an insulating adhesive are dispersed and mixed in a solvent such as toluene. The mixture is coated to a desired thickness on a release-treated PET film, and then dried at a temperature of about 80° C. to produce an anisotropic conductive adhesive layer film. Next, the two films are overlaid, and then the films are combined by pressing at about 40° C. via the release films on either side, to obtain the anisotropic conductive film of the present invention.

Figure 2:
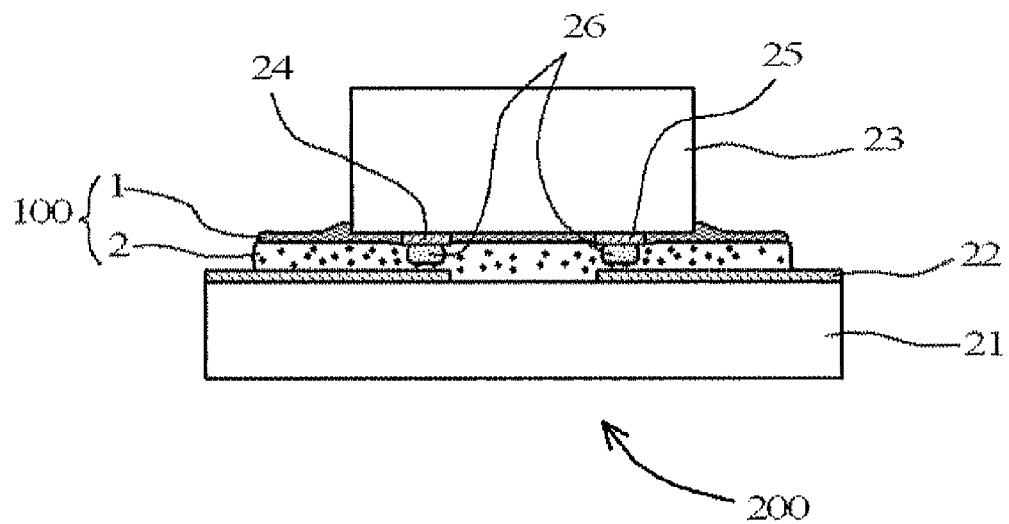
FIG. 2 is a cross sectional view of a light emitting device of the present invention.
Figure 3:
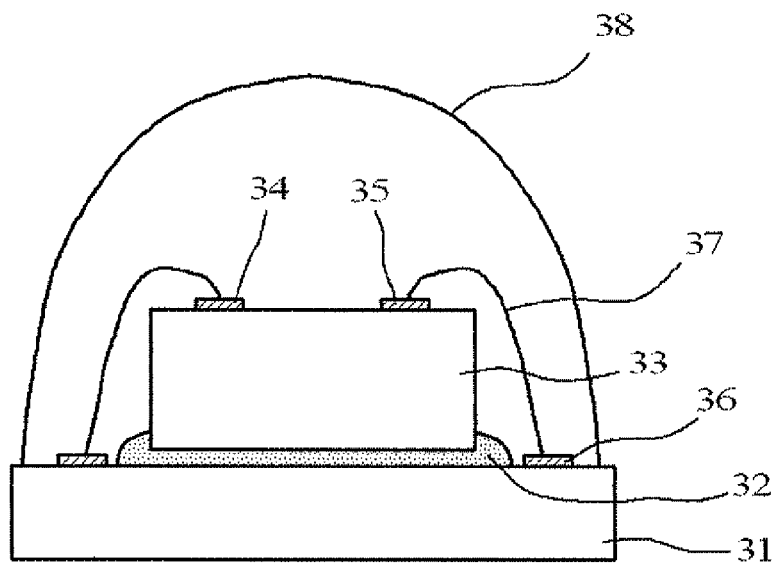
FIG. 3 is a cross sectional view of a conventional light emitting device.
Figure 4:
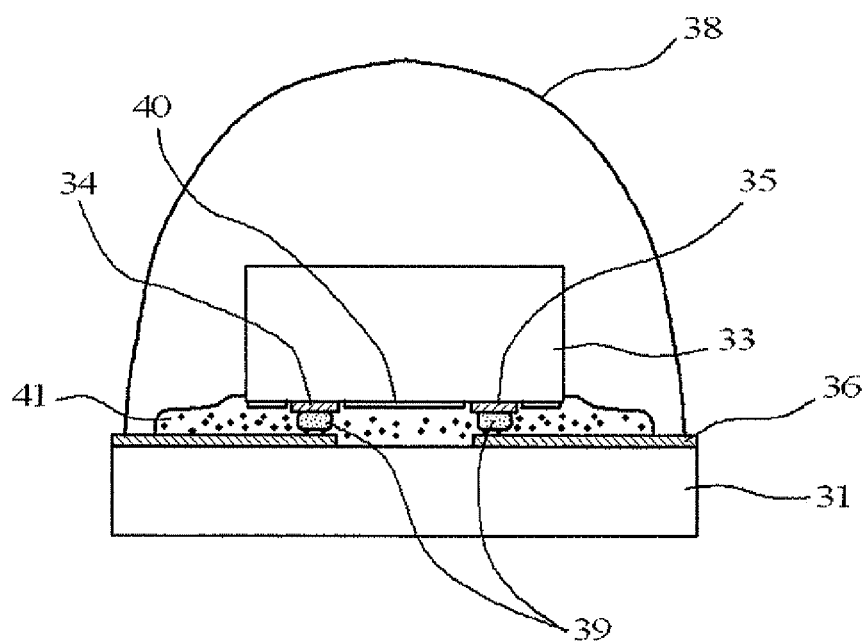
FIG. 4 is a cross sectional view of a conventional light emitting device.

Next, the light emitting device of the present invention will be described with reference to FIG. 2. A light emitting device 200 is formed by flip-chip mounting a substrate 21 and an LED element 23, with the above-described anisotropic conductive film 100 of the present invention provided between a connection terminal 22 on the substrate 21 and connection bumps 26 respectively formed on an n electrode 24 and a p electrode 25 of the LED element 23. More specifically, the anisotropic conductive film 100 is a layered structure formed from the light-reflecting insulating adhesive layer 1 and the anisotropic conductive adhesive layer 2. The light-reflecting insulating adhesive layer 1 is formed from light-reflecting particles dispersed in an insulating adhesive. In this case, although it is preferred that the light-reflecting insulating adhesive layer 1 of the anisotropic conductive film 100 be arranged on the LED element 23 side, the light-reflecting insulating adhesive layer 1 may also be arranged on the opposite side. Optionally, the whole of the LED element 23 may be sealed with a transparent mold resin.

In the thus-configured light emitting device 200, of the light emitted by the LED element 23, the light emitted toward the substrate 21 side is reflected by the light-reflecting insulating adhesive layer 1 of the anisotropic conductive film 100, and is output from the upper face of the LED element 23. Therefore, a deterioration in the emission efficiency can be prevented.

The parts (LED element 23, bumps 26, substrate 21, connection terminal 22 and the like) other than the anisotropic conductive film 100 in the light emitting device 200 may be configured in the same manner as in a conventional light emitting device. Further, other than using the anisotropic conductive film 100, the light emitting device 200 of the present invention can be produced by utilizing conventional anisotropic conductive connection techniques.

EXAMPLES

Example 1

(1a) Production of Light-Reflecting Particles

A flask equipped with a stirring device was charged with 5 g of scale-like silver particles (height 10 μm, width 10 μm, thickness 0.5 μm) and 50 ml of toluene. Then, while stirring, 0.25 g of a silane coupling agent (3-methacryloxypropyltriethoxysilane) was added to the mixture, and the resultant mixture was stirred at 25° C. for 60 minutes. Next, 2 g of methyl methacrylate, 2 g of 2-hydroxyethyl methacrylate, 0.04 g of benzoyl peroxide, and 1 g of 2,4-tolylene diisocyanate was added to the mixture. The resultant mixture was stirred at 80° C. for 12 hours to obtain scale-like silver particles having an insulating coating as light-reflecting particles. The average size of the light-reflecting particles including the insulating coating was a height of 10 μm, a width of 10 μm, and a thickness of 0.5 μm.

(1b) Production of Light-Reflecting Insulating Adhesive Layer Film

An acid anhydride (MH-700, New Japan Chemical Co., Ltd.) and an imidazole (2MZA, Shikoku Chemicals Corporation) were added to a hydrogenated epoxy resin (YX8000, JER Co., Ltd.) to prepare an insulating binder resin. One-hundred parts by mass of the obtained insulating binder resin and 50 parts by mass of the scale-like silver particles having an insulating coating were dispersed and mixed into 100 ml of toluene. The resultant mixture was coated on a release polyethylene terephthalate (PET) film so that the dry thickness would be 10 μm, and then dried at 80° C. for 5 minutes to obtain a light-reflecting insulating adhesive layer film.

(1c) Production of Anisotropic Conductive Adhesive Layer Film

One-hundred parts by mass of the same insulating binder resin as in (1b) and 20 parts by mass of silver-plated resin particles (particle size 5 μm) were dispersed and mixed into 100 ml of toluene. The resultant mixture was coated on a release polyethylene terephthalate (PET) film so that the dry thickness would be 10 μm, and then dried at 80° C. for 5 minutes to obtain an anisotropic conductive adhesive layer film.

(1d) Production of Anisotropic Conductive Film

The obtained light-reflecting insulating adhesive layer film and anisotropic conductive adhesive layer film were overlaid, and then the two films were laminated by pressing them together at 40° C. for 10 seconds via the PET films on either side to obtain an anisotropic conductive film.

<Property Evaluation>

Using a 200° C. heating head, a light emitting diode element (properties when If=20 mA of Vf=3.3 V, luminous intensity=150 mcd, dominant wavelength=470 nm) was adhered to a glass epoxy substrate with the anisotropic conductive film interposed therebetween by thermal-pressing at 1 kg/chip for 20 seconds. During this process, because pressure was applied on the bump portions of the light emitting diode element, the adhesive in the light-reflecting insulating adhesive layer film could be removed, so that conduction was achieved between the light emitting diode element and the glass epoxy substrate via the conductive particles in the anisotropic conductive adhesive layer. Other than the bumps, the light-reflecting insulating adhesive layer was not removed, so that the light-reflecting function was maintained.

The obtained light emitting device was made to emit light, and the initial luminance (kcd/m$^2$) of the light output from the upper face was measured using a luminance meter (BM-9, Topcon Technohouse Corporation). Further, the LED lighting reliability was evaluated by flowing a constant current of 20 mA at 100° C. to the LED, and evaluating cases in which the variation in Vf value was within ±0.3 V as a "circle" and cases in which the variation in Vf value was more than ±0.3 V as a "cross". The obtained results are shown in Table 1.

Example 2

A light-reflecting insulating adhesive layer film and an anisotropic conductive adhesive layer film were produced in the same manner as in Example 1, except that 50 parts by mass of titanium dioxide particles (JR405, Tayca Corporation) having an average particle size of 0.2 μm were used as the light-reflecting particles instead of the scale-like silver particles having an insulating coating. In addition, an anisotropic conductive film was also produced in the same manner as in Example 1. Using this anisotropic conductive film, a light emitting diode element was connected to a glass epoxy substrate, and the properties were evaluated, in the same manner as in Example 1. The obtained results are shown in Table 1.

Comparative Example 1

Using a silver paste instead of an anisotropic conductive film, a light emitting diode was connected to a glass epoxy substrate, and the properties were evaluated in the same manner as in Example 1. The obtained results are shown in Table 1.

Comparative Example 2

Without using a light-reflecting insulating adhesive layer film, but using the exact same anisotropic conductive adhesive layer film as in Example 1 as an anisotropic conductive film, a light emitting diode element was connected to a glass epoxy substrate, and the properties were evaluated, in the same manner as in Example 1. The obtained results are shown in Table 1.

TABLE 1

|  |  | Comparative Example 1 | Comparative Example 2 | Example 1 | Example 2 |
|---|---|---|---|---|---|
| Light-Reflecting Layer | Particles | — | — | Scale-Like Ag Particles | $TiO_2$ Particles |
|  | Insulating Film | — | — | Yes | No |
| Conductive Layer | Particles | Ag Paste | Ag-Plated Resin Particles | Ag-Plated Resin Particles | Ag-Plated Resin Particles |
| Initial Luminance ($kcd/m^2$) |  | 40 | 26 | 45 | 40 |
| LED Lighting Reliability |  | x | ○ | ○ | ○ |

As can be seen from Table 1, in Example 1, since scale-like Ag particles having an insulating coating were used, the initial luminance was higher than for a silver paste (Comparative Example 1). In addition, the LED lighting reliability was also good. Further, in Example 2, since $TiO_2$ particles were used, initial luminance was comparable to that for a silver paste (Comparative Example 1), yet the LED lighting reliability was also good. In Comparative Example 2, since a light-reflecting layer was not included, there was a problem with the initial luminance.

INDUSTRIAL APPLICABILITY

The anisotropic conductive film of the present invention has a structure formed by laminating a light-reflecting insulating adhesive layer and an anisotropic conductive adhesive layer. Therefore, in a light emitting device produced by anisotropic conductive connection of an LED element and a substrate using this anisotropic conductive film, of the light emitted by the LED element, the light emitted towards the substrate side (i.e., the back face side of the LED element) can be reflected by the light-reflecting insulating adhesive layer and output from the front face side. Consequently, the emission efficiency of the light emitting device can be prevented from deteriorating. Therefore, the anisotropic conductive film of the present invention is useful when flip-chip mounting an LED element.

DESCRIPTION OF REFERENCE NUMERAL

| 1 | light-reflecting insulating adhesive layer |
|---|---|
| 2 | anisotropic conductive adhesive layer |
| 21 | substrate |
| 22 | connection terminal |
| 23 | LED element |
| 24 | n electrode |
| 25 | p electrode |
| 26 | connection bump |
| 100 | anisotropic conductive film |
| 200 | light emitting device |

The invention claimed is:

1. An anisotropic conductive film having a structure in which a light-reflecting insulating adhesive layer and an anisotropic conductive adhesive layer are laminated, wherein the light-reflecting insulating adhesive layer has a structure in which light-reflecting particles are dispersed in an insulating adhesive.

2. The anisotropic conductive film according to claim 1, wherein the light-reflecting particle is a metal particle covered with an insulating coating.

3. The anisotropic conductive film according to claim 2, wherein the metal particle is a scale-like silver particle.

4. The anisotropic conductive film according to claim 2, wherein the insulating coating with which the scale-like metal particle is covered is a cured acrylic resin.

5. The anisotropic conductive film according to claim 4, wherein the insulating coating is cross-linked with an isocyanate cross-linking agent.

6. The anisotropic conductive film according to claim 4, wherein the insulating coating is a coating formed by radical copolymerization of methyl methacrylate and 2-hydroxyethyl methacrylate.

7. The anisotropic conductive film according to claim 3, wherein the insulating coating with which the scale-like metal particle is covered is a cured acrylic resin.

8. A light emitting device in which a light emitting diode element is flip-chip-mounted on a substrate, with an anisotropic conductive film provided between a connection terminal on the substrate and a bump for connection of the light emitting diode element, wherein the anisotropic conductive film is a structure in which a light-reflecting insulating adhesive layer and an anisotropic conductive adhesive layer are laminated, the light-reflecting insulating adhesive layer being a structure in which light-reflecting particles are dispersed in an insulating adhesive.

9. The light emitting device according to claim 8, wherein the light-reflecting insulating adhesive layer of the anisotropic conductive film is arranged on a side of the light emitting diode element.

10. An anisotropic conductive film for flip-chip mounting a substrate and a light emitting diode element, wherein the anisotropic conductive film is a structure in which a light-reflecting insulating adhesive layer and an anisotropic conductive adhesive layer are laminated, and the light-reflecting insulating adhesive layer is a structure in which light-reflecting particles are dispersed in an insulating adhesive.

11. The anisotropic conductive film according to claim 7, wherein the insulating coating is cross-linked with an isocyanate cross-linking agent.

12. The anisotropic conductive film according to claim 7, wherein the insulating coating is a coating formed by radical copolymerization of methyl methacrylate and 2-hydroxyethyl methacrylate.

* * * * *